United States Patent
Su et al.

(10) Patent No.: US 7,301,280 B2
(45) Date of Patent: Nov. 27, 2007

(54) ORGANIC LIGHT EMITTING DISPLAY DEVICE WITH PASSIVATION STRUCTURE

(75) Inventors: Chih-Hung Su, Hsin-Chu (TW); Ta-Chin Wei, Chung-Li (TW)

(73) Assignee: AU Optronics Corp., Hsin-Chu (TW)

( * ) Notice: Subject to any disclaimer, the term of this patent is extended or adjusted under 35 U.S.C. 154(b) by 121 days.

(21) Appl. No.: 10/707,933

(22) Filed: Jan. 26, 2004

(65) Prior Publication Data

US 2004/0145311 A1    Jul. 29, 2004

(30) Foreign Application Priority Data

Jan. 29, 2003    (TW) ............... 92102074 A

(51) Int. Cl.
*H05B 33/00* (2006.01)
(52) U.S. Cl. ............... 313/512; 313/504
(58) Field of Classification Search ........ 313/503–506, 313/512; 428/690, 917; 257/59, 347
See application file for complete search history.

(56) References Cited

U.S. PATENT DOCUMENTS 5,811,177 A * 9/1998 Shi et al. ............... 428/209
5,952,778 A   9/1999 Haskal et al.
2002/0125822 A1   9/2002 Graff

FOREIGN PATENT DOCUMENTS

| JP | 7-147189 | 6/1995 |
|---|---|---|
| JP | 2001-326070 | 11/2001 |
| TW | 379513 | 1/2000 |

* cited by examiner

*Primary Examiner*—Ashok Patel
(74) *Attorney, Agent, or Firm*—Winston Hsu

(57) ABSTRACT

A method of fabricating an organic light emitting display device, the method comprising: providing a substrate; forming an organic light emitting unit on the substrate; and forming a passivation structure layer including organic and inorganic contents over the organic light emitting unit and the substrate, wherein the passivation layer is formed by supplying one or more source compound of respective ratio varying in time.

6 Claims, 4 Drawing Sheets

ORGANIC LIGHT EMITTING DISPLAY DEVICE WITH PASSIVATION STRUCTURE

BACKGROUND OF INVENTION

1. Field of the Invention

The present invention relates to a method of fabricating an organic light emitting display device, and more particularly, to a method of fabricating an organic light emitting display device with a passivation structure.

2. Description of the Prior Art

The progress of science and technology has led to organic materials being well applied to all kinds of electrical devices. For example, organic light-emitting displays (OLEDs), which are formed by using organic materials, have the advantages of simpler structures, excellent operating temperature, high contrast, and a wide viewing angle, and have the beneficial characteristics of light-emitting diodes (LEDs), such as rectification and luminosity, so as to be used extensively in the field of display devices. Since the OLED uses luminous devices formed of organic materials to provide a light source, the OLED is very sensitive to moisture. Once the organic light-emitting devices are exposed to moisture, the cathode thereon may be oxidized and the interface of organic compounds may peel. This leads to dark spots being generated in the luminous devices, which deteriorates the brightness and the lifetime of the display devices. As a result, the package material used to package the electrical devices not only needs high anti-abrasiveness and thermal conductivity, but also requires low moisture permeability to prevent the organic materials from being exposed in the external environment effectively and to improve the lifetime of the electrical devices.

For example, in the conventional package process of display devices, a sealing agent made of polymer materials is often used to combine the container, which is composed of a metal or glass material, with the substrate, and a desiccant agent and dry nitrogen are filled into the empty region there between. However, this package structure can be only applied to the display devices with metal or glass substrates, but cannot be used in packaging those with the flexible substrates. In addition, the metal container has disadvantages of having a heavy weight, and being oxidized easily. In the fabricating process, the metal container also has disadvantages of pealing off from the glass materials easily and having the requirement of a high degree of flatness. The glass container has the disadvantages of having heavy weight, cracking easily, and pealing off easily due to stress differences. Moreover, most of the sealing agents composed of polymer materials lack adequate protection from moisture. As a result, although the electrical devices are packaged, the moisture of the external environment still permeates into the packaged device gradually and erodes the display devices so as to deteriorate the display effect and decrease the lifetime of the display devices.

In order to solve the above-mentioned problems of the metal or glass container, a new passivation process that utilizes films to encapsulate the protected devices is developed. Please refer to FIG. 1, which is a cross-sectional diagram of a passivation structure 16 disclosed in U.S. Pat. No. 5,811,177. As shown in FIG. 1, an OLED 10 mainly comprises a substrate 12, a display unit 14 positioned on the substrate 12, and a passivation structure 16 covering the display unit 14 and the substrate 12. The display unit 14 is composed of a plurality of pixels and further comprises a driving circuit (not shown) disposed on the substrate 12 for driving the pixels to display. The passivation structure 16, which is a multiple film structure, comprises a metal layer 18, a buffer layer 20, a thermal coefficient matching layer 22, a low permeability layer 24, and a sealing layer 26 stacked on the display unit 14 in sequence for protecting the display unit 14.

Furthermore, another passivation structure which utilizes a metal layer, inorganic materials and hydrophobic polymer materials is disclosed in U.S. Pat. No. 5,952,778. Another moisture-proof multi-layer structure is disclosed in Chinese Taipei Patent 379,531 to improve the above-mentioned problem. The structure includes a moisture-adsorbing resin layer, an adhesive layer, and a transparent resin layer, and covers an electroluminescent device to prevent the electroluminescent device from moistening and oxidizing.

As mentioned above, although most inorganic materials have a superior water repelling ability, the inorganic materials have a significant difference from the organic light emitting display unit, which is almost formed of organic materials, in the stress or the thermal expansion coefficient. The adhesion between the inorganic materials and the organic materials is also weak so that the inorganic materials are easily peeled from the organic light emitting display unit. As a result, though the conventional passivation structures have different package design or package materials, they typically utilize a polymer material as a buffer layer and stack the buffer layers and the inorganic materials in a staggered layout on the display unit to form an multi-layer passivation structure to prevent electrode materials or organic materials in the display device from being eroded or oxidized by the moisture and oxygen in the externalenvironment. Normally, some moisture sensitive electrical devices, such as the OLED, requires a passivation whose permeability is less than 0.05 $g/m^2$ day. Thus, most of the conventional passivation structures are composed of more than five stacked layers to meet the permeability requirement. However, although the multilayer structure can provide a better effect on moisture protection, there is the disadvantage of the complicated fabricating process, which leads to a high fabrication cost and long fabricating time.

Additionally, since the passivation structure 16 on the display unit is usually opaque, the organic light emitting display device has to use the transparent substrate beneath to display images in a bottom emission mode. When the size of the display device increases and the resolution thereof improves, the display device operates in an active driving method instead of the conventional passive driving method. In an active organic light emitting display device, each pixel needs an independent driving circuit so that more electrical devices are required and more area is occupied thereby. This leads to a decrease in the ratio of transmitting area in each pixel. As a result, when light beams generated from the organic light emitting display device pass downward through the transparent substrate to display images, some light beams are blocked by the driving circuit in each pixel so that the brightness of the organic light emitting display device is reduced and the display performance is therefore deteriorated. Thus, it is important to develop a new passivation structure and method thereof to solve the aforementioned problem.

SUMMARY OF INVENTION

It is therefore a primary objective of the claimed invention to provide a method of fabricating an organic light emitting display device to solve the problem mentioned above.

In a preferred embodiment of the claimed invention, a method of fabricating an organic light emitting display device is disclosed. First, an organic light emitting display unit is formed on a substrate. The organic light emitting display unit comprises an organic luminous layer and a driving circuit disposed on the substrate. Then, a passivation structure is formed to cover the organic light emitting display unit and the surface of the substrate. The passivation structure is formed of an organic/inorganic film. A latter formed part of the organic/inorganic film has a lower organic/inorganic ratio than a former.

It is an advantage of the claimed invention that the passivation structure is formed of a single organic/inorganic film. Thus, the fabricating process can be simplified significantly. By adjusting the organic/inorganic ratio properly, the passivation structure has the characteristics of the organic materials and the inorganic material at the same time so as to attach on the display unit perfectly and has an excellent water repelling ability to prevent the display unit beneath from being damaged by the moisture, oxygen, or other gases.

These and other objectives of the claimed invention will not doubt become obvious to those of ordinary skill in the art after reading the following detailed description of the preferred embodiment, which is illustrated in the various figures and drawings.

DETAILED DESCRIPTION

Figure 1:
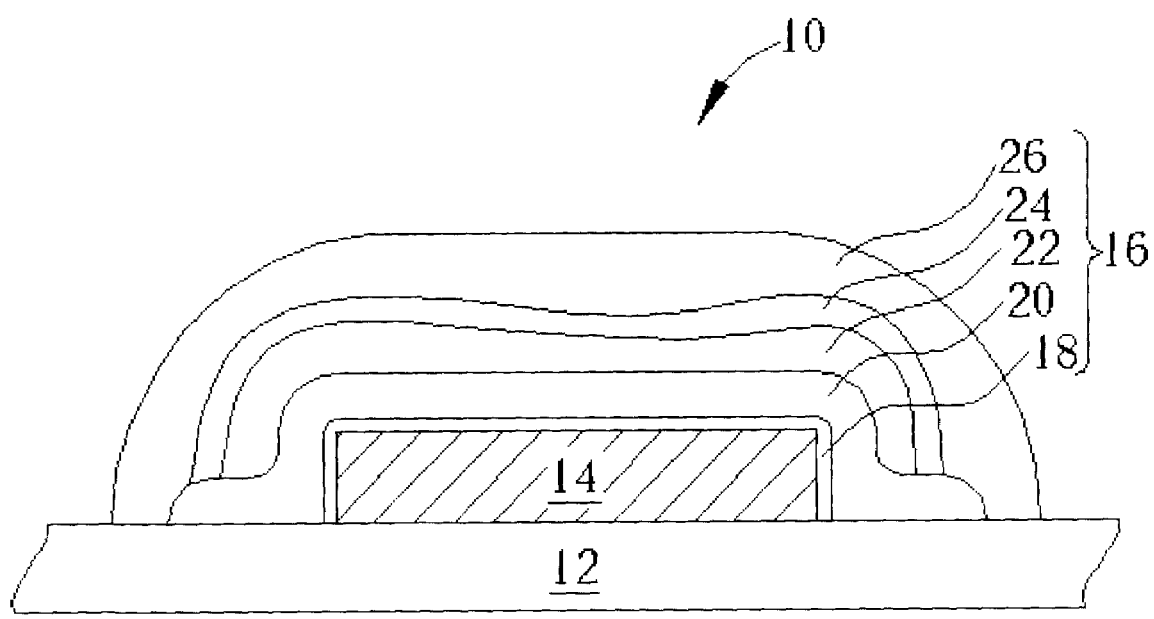
FIG. 1 is a schematic diagram of a passivation structure according to prior art.
Figure 2:
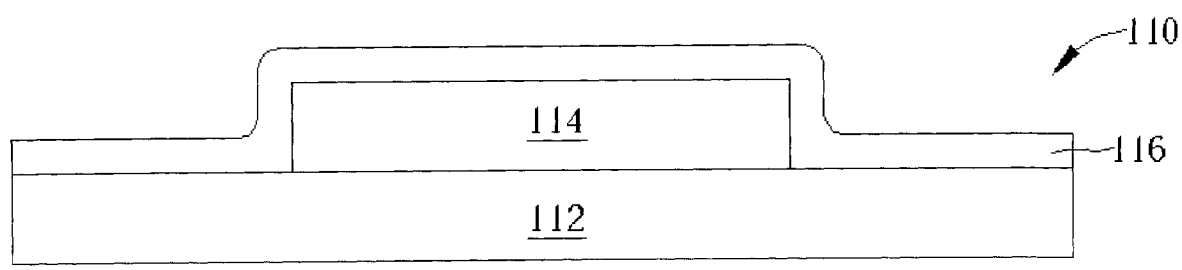
FIG. 2 is a schematic diagram of an organic light emitting display device according to a preferred embodiment of the present invention.

Please refer to FIG. 2, which is a schematic diagram of an organic light emitting display device 110 of a preferred embodiment of the present invention. As shown in FIG. 2, the organic light emitting display device 110 comprises a substrate 112, an organic light emitting display unit 114 positioned on the surface of the substrate 112, and a passivation layer 116 covering the organic light emitting display unit 114 and the substrate 112 for preventing the organic light emitting display unit 114 from being exposed to the external atmosphere.

Figure 3:
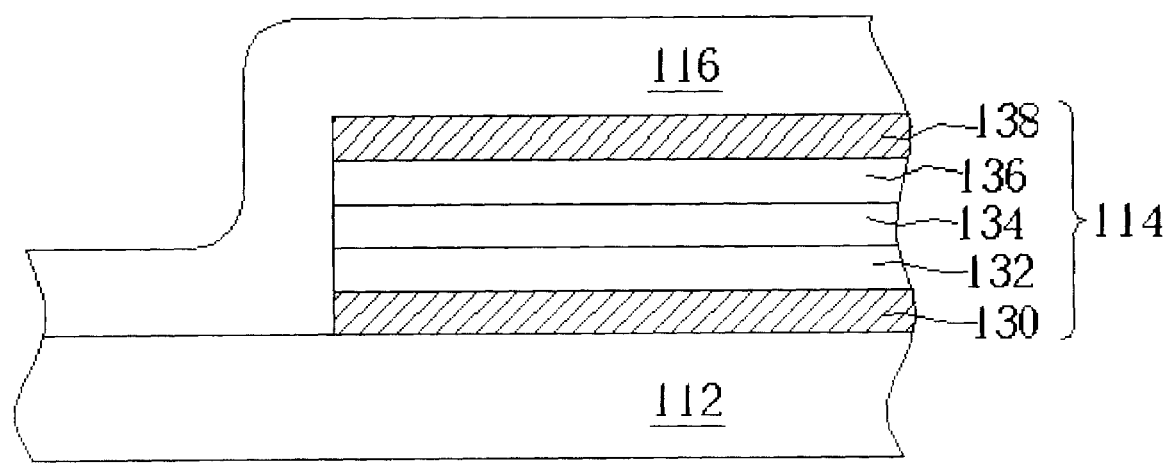
FIG. 3 is a local amplified diagram of the organic light emitting display device shown in FIG. 2.

Please refer to FIG. 3, which is an enlarged view showing the layer structure of the organic light emitting display device 110. As shown in FIG. 3, the organic light emitting display unit 114 is composed of a plurality of pixels. Each pixel is formed by a multi-layer structure, comprising a first electrode layer 130, a light-emitting layer 132, a metal layer 134, a dielectric layer 136, and a second electrode layer 138 stacked upon the substrate 112. In the preferred embodiment of the present invention, the substrate 112 is a glass substrate, a plastic substrate, or a metal substrate. The electrode layers 130 and 138 are usually composed of a transparent conductive material such as ITO or IZO. The metal layer 134 comprises alloys of Al—Mg, Al—Li, or Al—LiF. The light-emitting layer 132 is primarily formed of organic materials, such as an organic luminescent layer composed of conjugated polymers. The dielectric layer 136 comprises a silicon nitride layer, a silicon oxide layer, or a polymer layer. In addition, the organic light emitting display unit 114 further comprises an active driving circuit (not shown) composed of a plurality of thin film transistors arranged in matrix for driving the organic light emitting display device 110.

The passivation composite layer 116 is made of an organic/inorganic composite film formed by a physical vapor deposition (PVD) or chemical vapor deposition (CVD) process. By reducing the ratio between the reactant sources of the organic compounds and the inorganic compounds continuously during the fabricating process, the organic/inorganic ratio of the formed organic/inorganic composite film is also decreasing gradually. In an embodiment of the present invention, a part of the organic/inorganic film first formed has a organic/inorganic ratio higher than that of a part of the organic/inorganic film formed subsequently and being farther from the organic light emitting display unit 114.

The method of fabricating the organic light emitting display device 110 according to the present invention includes first forming an organic light emitting display unit 114 on the substrate 112 and then forming a passivation composite layer 116 on the organic light emitting display unit 114 and the substrate 112. Since the organic light emitting display unit 114 can be formed by any conventional method know in the art. The method of fabricating the passivation composite layer 116 is detailed as following.

Figure 4:
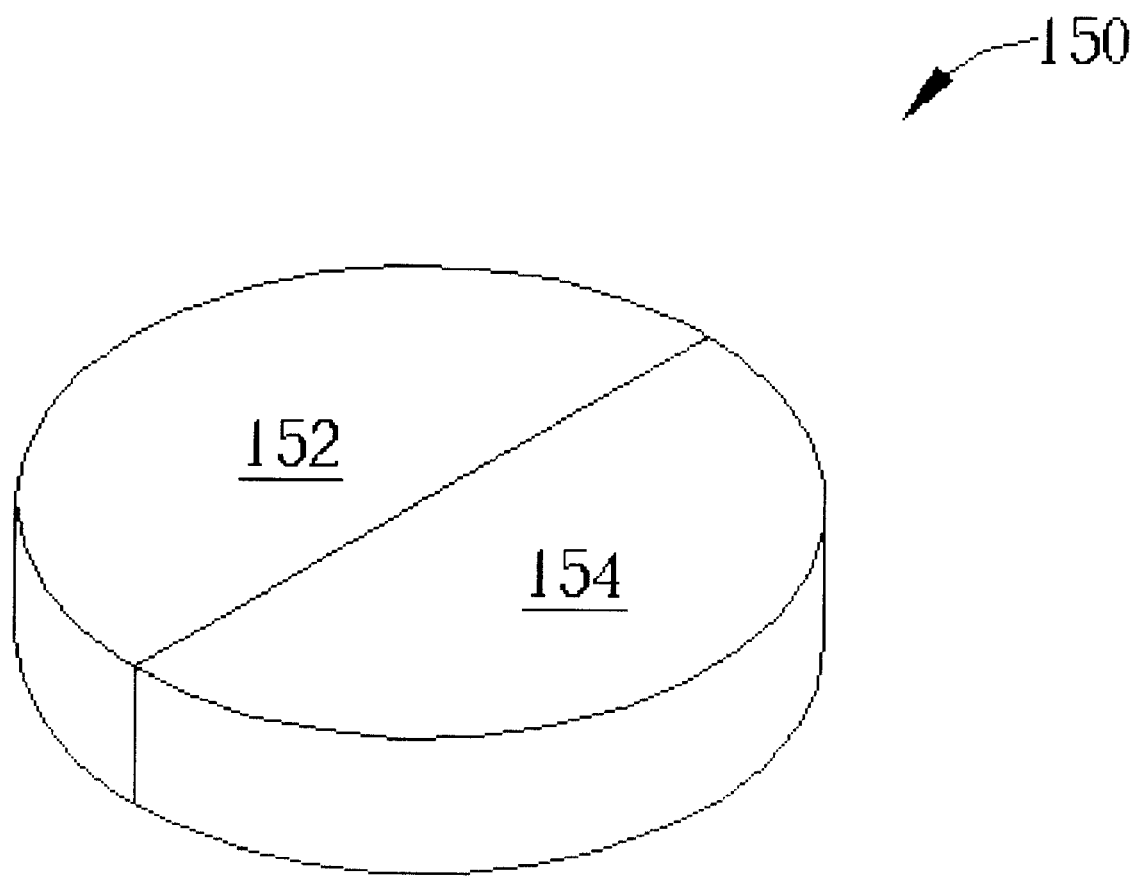
FIG. 4 is a schematic diagram of a mix target.

In an embodiment of the present invention, a sputtering process with a mix target is performed to form the passivation layer on the organic light emitting display unit 114. FIG. 4 is a schematic diagram of the mix target 150. As shown in FIG. 4, the mix target 150 comprises an organic material 152 and an inorganic material 154 on the surface of the mix target 150. Thus, the organic/inorganic ratio of the formed organic/inorganic film can be controlled by changing the ratio between the area of the organic material 152 and that of the inorganic material 154 on the surface of the mix target 150. In an embodiment, the organic/inorganic material ratio is gradually modified from 5:1 to 1:5. In an embodiment, the organic material 152 and the inorganic material 154 on the surface of the mix target 150 are PTFE and silicon oxide, respectively. The formed organic/inorganic film is a $SiO_xC_yH_z$ compound. In the sputtering process, a mask is used to control the exposed area of the organic material 152 and the inorganic material 154. By changing the relative position between the mask and the mix target 150 properly, the exposed area of organic material 152 can be reduced and/or the exposed area of inorganic material 154 can be increased so that the organic/inorganic ratio of the formed organic/inorganic film can be changed gradually along the thickness of the passivation layer. The inner side of the passivation layer structure 116 adjacent to the organic light emitting display unit 114 has a higher content of organic material and therefore exhibits characteristics substantially similar to those of the organic material, i.e. an excellent adhesion and a thermal expansion coefficient and a stress matching with those of the organic light emitting display unit 114. In contrast, the outer side of the passivation layer structure 116 has a high content of inorganic material and thereby exhibits a high water repelling ability characteristic of inorganic materials.

The passivation layer 116 in the present invention can be also formed according to other methods. For example, trimethylchlorosilane (TMCS) or hexamethyl disilazane (HMDS) can be used as the gas source to perform a plasma enhanced chemical vapor deposition with an oxygen plasma and thereby produce an organic/inorganic film formed of a $SiO_xC_yH_z$ compound covering the organic light emitting display unit 114 and the substrate 112. In the same manner, different methods can be used to control the ratio among x, y, and z in the fabricating process so that the $SiO_xC_yH_z$ compound formed earlier has a higher organic/inorganic ratio, which has a higher y and z, and the organic/inorganic ratio decreases gradually, in which y and z are smaller, in the latter fabrication.

In addition, although the $SiO_xC_yH_z$ compound is disclosed in the previous embodiment, the organic/inorganic film can also be composed of other materials, such as $SiN_xC_yH_z$, or $SiO_wN_xC_yH_z$ compounds according the requirement of products.

It is noted that the organic/inorganic film in the present invention not only has the characteristics of organic materials and inorganic materials simultaneously but also has a high transmittance in a range of 40 to 90% by using suitable materials and controlling the fabricating parameter properly. Consequently, the organic light emitting display device 110 can not only display in a bottom emission mode through the glass substrate 112 but also display in a top emission mode through the passivation structure 116 composed of the high transmittance organic/inorganic film at the same time. Thus, the display performance is not affected by the electrical devices positioned on the surface of the substrate 112 so as to overcome the problem in the prior art caused by a high density of electrical devices.

In contrast with the prior art, the passivation structure in the present invention is formed of an organic/inorganic film. By controlling the organic/inorganic ratio of the organic/inorganic film in the fabricating process, the passivation structure can have characteristics of both organic materials and inorganic materials. It means that the passivation structure can have a stress and a thermal expansion coefficient matching with the organic light emitting display unit and have a high water repelling ability of the inorganic materials so as to provide an excellent package performance, achieve the purpose of improving the display performance, and lengthen the lifetime of the electrical devices. In addition, by choosing suitable materials of the organic/inorganic film, a high transmittance passivation structure can be made. Thus, a top emission mode can be used in display images to overcome the low display performance problem in the prior art caused by the high dense of electrical devices. Furthermore, comparing with the prior art passivation structure which is a multi-layer stacked structure, the passivation structure is a single layer structure and can be formed in a single process. Therefore, it not only solves the peeling problem occurring in the interfaces between different materials, but also simplifies the fabricating process, leading to lowering the manufacturing cost, reducing the fabricating time, and improving the capacity thereby.

Those skilled in the art will readily observe that numerous modifications and alterations of the invention may be made while retaining the teachings of the invention. Accordingly, the above disclosure should be construed as limited only by the metes and bounds of appended claims.

The invention claimed is:

1. An organic light emitting display, comprising:
   a substrate;
   an organic light emitting unit on the substrate, and
   a single-layered passivation layer covering the organic light emitting unit, wherein the passivation layer is made of a chemical compound reacted by organic and inorganic materials, and the chemical compound has a gradually varying organic/inorganic ratio from an inner side of the passivation layer adjacent to the organic light emitting unit to an outer side of the passivation layer.

2. The organic light emitting display of claim 1, wherein the organic content is preponderant in a portion of the passivation layer adjacent to the organic light emitting unit.

3. The organic light emitting display of claim 1, wherein the inorganic content is preponderant in a portion of the passivation layer not in contact with the organic light emitting unit.

4. The organic light emitting display of claim 1, wherein a thickness of the passivation layer is in a range of about 500 to 5000 angstroms.

5. The organic light emitting display of claim 1, wherein the passivation layer includes SiOxCyHz, SiNxCyHz, or SiOwNxCyHz compounds.

6. The organic light emitting display device of claim 1, wherein the passivation layer has light transmittance in a range of about 40 to 90%.

* * * * *